United States Patent
Kraus et al.

(10) Patent No.: US 9,287,228 B2
(45) Date of Patent: Mar. 15, 2016

(54) METHOD FOR ETCHING SEMICONDUCTOR STRUCTURES AND ETCHING COMPOSITION FOR USE IN SUCH A METHOD

(71) Applicants: Harald Kraus, Hof (DE); Hebert Schier, Landskron (AT)

(72) Inventors: Harald Kraus, Hof (DE); Hebert Schier, Landskron (AT)

(73) Assignee: LAM RESEARCH AG, Villach (AT)

( * ) Notice: Subject to any disclaimer, the term of this patent is extended or adjusted under 35 U.S.C. 154(b) by 0 days.

(21) Appl. No.: 14/316,558

(22) Filed: Jun. 26, 2014

(65) Prior Publication Data

US 2015/0380370 A1 Dec. 31, 2015

(51) Int. Cl.
- *H01L 21/302* (2006.01)
- *H01L 21/461* (2006.01)
- *H01L 23/00* (2006.01)
- *H01L 21/3213* (2006.01)
- *C23F 1/26* (2006.01)

(52) U.S. Cl.
CPC . *H01L 24/11* (2013.01); *C23F 1/26* (2013.01); *H01L 21/32134* (2013.01); *H01L 2224/11614* (2013.01); *H01L 2924/01013* (2013.01); *H01L 2924/01022* (2013.01); *H01L 2924/01029* (2013.01); *H01L 2924/0549* (2013.01); *H01L 2924/206* (2013.01); *H01L 2924/20102* (2013.01)

(58) Field of Classification Search
CPC .................. H01L 21/67028; H01L 21/32134; H01L 24/03; H01L 2224/03831
USPC ............ 438/754, 745; 257/E21.219, E21.508
See application file for complete search history.

(56) References Cited

U.S. PATENT DOCUMENTS

| | | | |
|---|---|---|---|
| 3,107,188 A | | 10/1963 | Hancock et al. |
| 3,290,570 A | * | 12/1966 | Cunningham et al. ........ 257/763 |
| 3,867,218 A | | 2/1975 | Henry |
| 5,310,457 A | | 5/1994 | Ziger |
| 5,470,421 A | | 11/1995 | Nakada et al. |
| 5,472,562 A | | 12/1995 | Ziger |
| 6,228,765 B1 | * | 5/2001 | Moussavi et al. ............. 438/678 |
| 6,613,693 B1 | | 9/2003 | Heo et al. |
| 6,878,465 B2 | | 4/2005 | Moon et al. |
| 7,064,436 B2 | * | 6/2006 | Ishiguri et al. ................. 257/738 |
| 7,279,407 B2 | * | 10/2007 | Akram .................. H01L 21/288 257/E21.174 |
| 7,800,240 B2 | | 9/2010 | Yu |
| 8,389,397 B2 | * | 3/2013 | Lei et al. ........................ 438/614 |
| 8,409,970 B2 | | 4/2013 | Lin et al. |
| 8,470,710 B2 | * | 6/2013 | Gambee et al. ............... 438/669 |
| 2004/0266163 A1 | * | 12/2004 | Horng ..................... H01L 24/11 438/614 |
| 2006/0252225 A1 | * | 11/2006 | Gambee ............ H01L 21/31133 438/400 |

(Continued)

OTHER PUBLICATIONS

Dae-Hong Eom et al., "Effect of H2O2 and IPA Addition in Dilute HF Solutions on Surface Etching and Particle Removal Efficiency", Cleaning technology semiconductor device manufacturing : proceedings of the seventh international symposium (2001), Iksan, 570-140, Korea.

(Continued)

*Primary Examiner* — Nitin Parekh
(74) *Attorney, Agent, or Firm* — Young & Thompson

(57) ABSTRACT

A method of etching a semiconductor structure, comprises contacting an under bump metallization (UBM) with an etching composition. The UBM includes an underlying layer comprising titanium and an overlying layer comprising a second metal. The etching composition is a liquid comprising at least 0.1 wt % hydrofluoric acid and at least 0.1 wt % phosphoric acid.

14 Claims, 1 Drawing Sheet

(56) References Cited

U.S. PATENT DOCUMENTS

2012/0064712 A1* 3/2012 Lei ............... H01L 21/67028
438/614
2013/0270217 A1* 10/2013 Yoshida et al. ............ 216/13
2013/0341785 A1* 12/2013 Fu .................. H01L 23/3192
257/737

OTHER PUBLICATIONS

M.K. Md Arshad et al., "Under Bump Metallurgy (UBM)—A Technology Review for Flip Chip Packaging", International Journal of Mechanical and Materials Engineering (IJMME), vol. 2 (2007), No. 1, 48-54; 02600 Arau, Perlis.

* cited by examiner

METHOD FOR ETCHING SEMICONDUCTOR STRUCTURES AND ETCHING COMPOSITION FOR USE IN SUCH A METHOD

BACKGROUND OF THE INVENTION

1. Field of the Invention

The invention relates to a method for etching semiconductor structures and to an etching composition for use in such a method.

2. Description of Related Art

Under bump metallization is being increasingly used in preference to wire bonding, to connect a semiconductor device to a packaging substrate. This metallization is not limited to the outer perimeter of the device, but may also be deposited on the top metal level of the device at a final stage of wafer processing.

In a typical under bump metallization structure, a bump or pillar of solder is connected to an underlying contact pad, which is typically aluminum, via an under bump metallization (UBM) made up of two or more layers. For example a lower layer in contact with the contact pad may promote adhesion of the bump to the contact pad and also functions as a diffusion barrier to protect the underlying integrated circuit, whereas an upper layer in contact with the solder bump is formed from a material that is wettable by the solder so as to strengthen the bond between the bump and the contact pad.

One conventional UBM structure includes a lower layer comprising titanium and an upper layer comprising copper. When such a structure is etched to form its final shape, the underlying titanium layer is etched to a greater extent than the overlying copper layer, resulting in undercut. This undercut results in less contact area to the metallic contact pad, as well as stress in the bump.

Conventional etching techniques using dilute hydrofluoric acid (dHF) produce an undercut not less than about 1 µm, whereas benchmarks for future generations of technology call for an undercut of 0.5 µm or less. Alkaline etching chemistries and hydrogen peroxide blends are also unsatisfactory, owing to their slow etch rates and high temperature requirements.

SUMMARY OF THE INVENTION

Thus, in one aspect, the present invention relates to a method of etching a semiconductor structure, comprising contacting an under bump metallization (UBM) with an etching composition. The UBM includes an underlying layer comprising titanium and an overlying layer comprising a second metal. The etching composition is a liquid comprising at least 0.1 wt % hydrofluoric acid and at least 0.1 wt % phosphoric acid.

In preferred embodiments of the method according to the present invention, the second metal is copper.

In preferred embodiments of the method according to the present invention, the contacting is performed for a time sufficient to over etch the underlying layer by at least 100% after nominal removal of the underlying layer.

In preferred embodiments of the method according to the present invention, the underlying layer is a composite material comprising aluminum sandwiched between top and bottom layers of titanium second metal is copper.

In preferred embodiments of the method according to the present invention, the underlying layer overlies a contact pad of a semiconductor device.

In preferred embodiments of the method according to the present invention, the contacting is performed until the contact pad is exposed by removal of at least a part of said underlying layer.

In preferred embodiments of the method according to the present invention, the contact pad is formed in a semiconductor substrate.

In preferred embodiments of the method according to the present invention, the contact pad is formed in an interlayer insulating film.

In preferred embodiments of the method according to the present invention, the contact pad comprises aluminum.

In preferred embodiments of the method according to the present invention, upon completion of said contacting an undercut of the underlying layer relative to the overlying layer is less than or equal to 0.5 µm.

In preferred embodiments of the method according to the present invention, the undercut is less than or equal to 0.3 µm.

In preferred embodiments of the method according to the present invention, the etching composition comprises from 0.5 wt % to 20 wt % hydrofluoric acid, from 0.5 wt % to 20 wt % phosphoric acid and at least 60 wt % deionized water.

In preferred embodiments of the method according to the present invention, the contacting is performed at a temperature from 15° C. to 30° C.

In preferred embodiments of the method according to the present invention, the contacting is performed at a temperature from 20° C. to 25° C.

In another aspect, the present invention relates to an etching composition, wherein the etching composition is a liquid comprising at least 0.1 wt % hydrofluoric acid, at least 0.1 wt % phosphoric acid and greater than 50% deionized water.

In preferred embodiments of the etching composition according to the present invention, the composition comprises from 0.5 wt % to 20 wt % hydrofluoric acid, from 0.5 wt % to 20 wt % phosphoric acid and at least 60 wt % deionized water.

In preferred embodiments of the etching composition according to the present invention, the composition consists essentially of from 0.5 wt % to 20 wt % hydrofluoric acid, from 0.5 wt % to 20 wt % phosphoric acid, balance deionized water.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
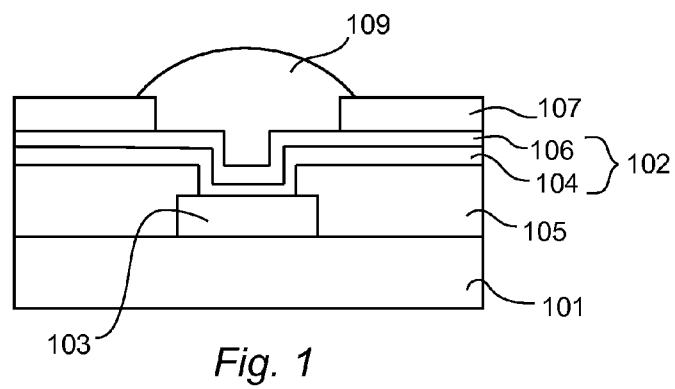
FIG. 1 is a cross-sectional view of a semiconductor device on which layers for a UBM and a solder bump have been formed, but which has not yet been wet etched.

In FIG. 1, a semiconductor substrate 101 such as a silicon wafer has any of various semiconductor devices formed thereon. A contact pad 103, sometimes referred to as a bonding pad or landing pad, is formed overlying and in contact with the semiconductor substrate 101. The contact pad 103 is preferably formed of aluminum, but may instead be formed of other conductive materials such as copper.

Surrounding the contact pad 103 is a passivation layer 105. The passivation layer 105 may serve to shield the substrate 101 from contaminants and moisture, as well as to prevent corrosion or other damage to the substrate and components formed thereon. Passivation layer 105 may comprise silicon dioxide, silicon nitride, or an organic material such as polyimide.

In the present embodiment, contact pad 103 is formed in the semiconductor substrate 101; alternatively, contact pad 103 could be formed in an interlayer insulating film (not shown).

An opening in the passivation layer 105 exposes contact pad 103.

UBM structure 102 overlies the passivation layer 105 in this embodiment, and fills the opening through which the contact pad 103 is exposed, such that UBM 102 contacts the contact pad 103.

More particularly, UBM 102 is made up of a lower layer 104 that comprises titanium, and an upper layer 106 that comprises copper. Each of the layers 104 and 106 may in turn be composed of two or more sublayers, and it will be appreciated by those skilled in this art that the titanium of lower layer 104 may be present in fewer than all of the sublayers of layer 104. Similarly, the copper of upper layer 106 may be present in fewer than all of the sublayers of layer 106.

For example, layer 104 could be a composite material comprising aluminum sandwiched between top and bottom layers of titanium.

A layer of patterned photoresist 107 covers the UBM 102 in selected regions, while exposing it in others. A solder bump 109 contacts the UBM 102 through an opening in the photoresist layer 107.

Figure 2:
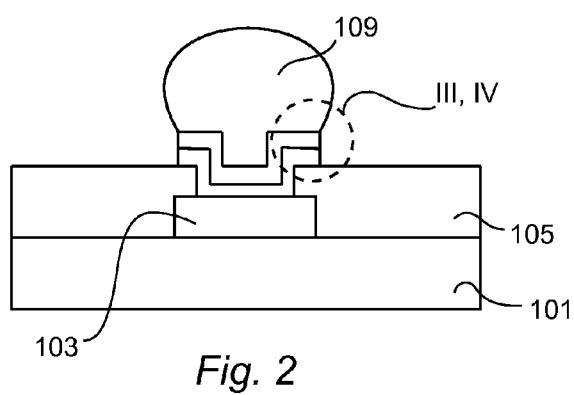
FIG. 2 is a cross-sectional view of the semiconductor device of FIG. 1, after wet etching has been performed to delimit the UBM structures.

In the processing that generates the structure shown in FIG. 2 from the structure shown in FIG. 1, typically the photoresist layer 107 is first stripped away by any suitable conventional technique.

Figure 3:
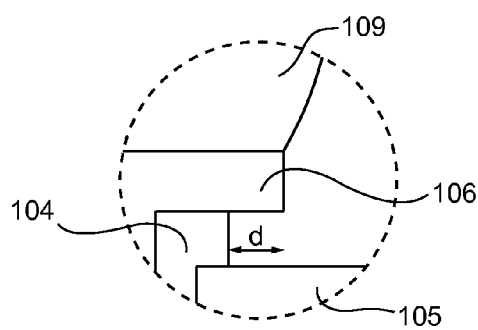
FIG. 3 is a close-up of the detail III in FIG. 2, illustrating the underetch phenomenon that occurs when using conventional techniques and compositions.

Then, the UBM undergoes a wet etching process so as to remove the layers 104 and 106 in the regions not covered by the solder bump 109, to produce the structure shown in FIG. 2. However, when a conventional etching composition is used, such as dilute hydrofluoric acid (dHF), the layer 104 is heavily undercut, as shown in FIG. 3. In particular, the extent of undercut d indicated in FIG. 3 is typically 1.0 μm or more.

Experiments conducted by the present inventors have shown that, as soon as the lower layer 104 is reached by the etchant, removal of titanium occurs very quickly. This, and the galvanic corrosion due to the titanium of layer 104 being in contact with the copper of layer 106 in this embodiment, leads to severe undercutting of layer 104 below layer 106.

Figure 4:
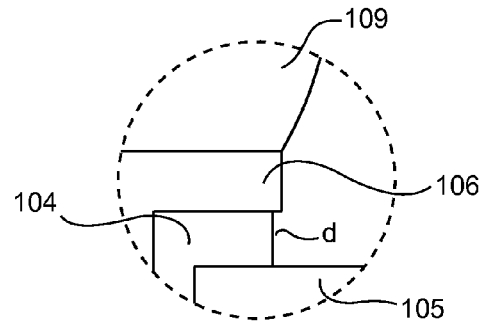
FIG. 4 is a close-up of the detail IV in FIG. 2, illustrating the underetch phenomenon that occurs when using the methods and etching compositions according to preferred embodiments of the present invention.

On the other hand, the present inventors have surprisingly discovered that a mixture of phosphoric acid ($H_3PO_4$) and hydrofluoric acid (HF), inclusive of mixtures of the foregoing components with deionized water, reduces the extent d of undercut to less than 0.5 μm, as shown in FIG. 4. Furthermore, the use of such an etching composition also reduces the extent of corrosion of contact pad 103 when the same is made of aluminum.

Without wishing to be held to any particular theory, it is considered that adding $H_3PO_4$ to dHF reduces the undercut by reducing the galvanic corrosion. Addition of $H_3PO_4$ may alter the surfaces of Cu and Ti in such a way that the dissolution of Ti is suppressed.

The etching composition preferably comprises at least 0.1 wt % hydrofluoric acid, at least 0.1 wt % phosphoric acid and greater than 50% deionized water. More preferably, it comprises from 0.5 wt % to 20 wt % hydrofluoric acid, from 0.5 wt % to 20 wt % phosphoric acid and at least 60 wt % deionized water. The contacting is preferably performed at a temperature from 15° C. to 30° C., and more preferably from 20° C. to 25° C.

The following table shows various wet etching compositions that were tested by the present inventors, including the associated process temperatures, the extent of titanium over etch after nominal removal of titanium, and the resulting magnitude of undercut d.

| Etchant | Temperature | Ti over etch after nominal removal of Ti | Ti undercut |
| --- | --- | --- | --- |
| DI:HF 100:1 | RT | 80% | 0.3 μm-0.5 μm |
| DI:$H_3PO_4$:HF 100:1:1 | RT | 200% | <0.2 μm |
| $H_3PO_4$:HF 100:1 | RT | 200% | <0.2 μm |
| $H_3PO_4$:HF 1:100 | RT | >150% | 0.4 μm |
| $H_3PO_4$:HF:DI 3:1:100 | 40° C. | 150% | 0.2 μm |
| $H_3PO_4$:HF:DI 3:1:100 | RT | 200% | <0.2 μm |

As shown in the foregoing table, the combined use of phosphoric acid and hydrofluoric acid in the wet etching composition resulted in substantially less titanium undercut than the use of conventional dilute hydrofluoric acid alone. Furthermore, the above table shows that, when using mixtures of phosphoric acid and hydrofluoric acid, the extent of undercut could be limited even when over-etching the titanium layer 104 to a much greater extent. Such overetching can be important to ensure complete removal of layer 104 following detection of an endpoint signal indicating nominal removal of the layer 104, as when the layer 104 is relatively uneven and significant portions of layer 104 remain even after the layer 105 has been partly exposed.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. A method of etching a semiconductor structure, comprising:
   contacting an under bump metallization (UBM) with an etching composition;
   wherein the UBM includes an underlying layer comprising titanium and an overlying layer comprising a second metal; and
   wherein the etching composition is a liquid comprising at least 0.1 wt % hydrofluoric acid and at least 0.1 wt % phosphoric acid.

2. The method according to claim 1, wherein the second metal is copper.

3. The method according to claim 1, wherein said contacting is performed for a time sufficient to over etch the underlying layer by at least 100% after nominal removal of the underlying layer.

4. The method according to claim 1, wherein the underlying layer is a composite material comprising aluminum sandwiched between top and bottom layers of titanium.

5. The method according to claim 1, wherein the underlying layer overlies a contact pad of a semiconductor device.

6. The method according to claim 5, wherein said contacting is performed until the contact pad is partially exposed by removal of at least a part of said underlying layer.

7. The method according to claim 5, wherein the contact pad is formed in a semiconductor substrate.

8. The method according to claim 5, wherein the contact pad is formed in an interlayer insulating film.

9. The method according to claim 5, wherein the contact pad comprises aluminum.

10. The method according to claim 1, wherein upon completion of said contacting an undercut of the underlying layer relative to the overlying layer is less than or equal to 0.5 μm.

11. The method according to claim 10, wherein said undercut is less than or equal to 0.3 μm.

12. The method according to claim 1, wherein the etching composition comprises from 0.5 wt % to 20 wt % hydrofluoric acid, from 0.5 wt % to 20 wt % phosphoric acid and at least 60 wt % deionized water.

13. The method according to claim 1, wherein said contacting is performed at a temperature from 15° C. to 30° C.

14. The method according to claim 1, wherein said contacting is performed at a temperature from 20° C. to 25° C.

* * * * *